United States Patent [19]

Saxena

[11] Patent Number: 5,528,553
[45] Date of Patent: Jun. 18, 1996

[54] METHOD AND APPARATUS FOR TESTING RANDOM ACCESS MEMORY

[75] Inventor: Nirmal Saxena, San Jose, Calif.

[73] Assignee: HaL Computer Systems, Inc., Campbell, Calif.

[21] Appl. No.: 500,804

[22] Filed: Jul. 11, 1995

Related U.S. Application Data

[62] Division of Ser. No. 130,376, Oct. 1, 1993.

[51] Int. Cl.$^6$ ................................................. G11C 13/00
[52] U.S. Cl. ................ 365/230.01; 365/205; 365/230.03
[58] Field of Search .............................. 365/230.01, 205, 365/230.03, 230.04

[56] References Cited

U.S. PATENT DOCUMENTS 4,903,236  2/1990  Nakayama et al. ................. 365/230.01

Primary Examiner—Terrell W. Fears
Attorney, Agent, or Firm—Phong K. Truong; Charles E. Gotlieb

[57] ABSTRACT

A memory is tested by subjecting the memory to three phases of testing. In the first phase, a first address in the memory is initialized by writing an initial set of data to the address. Then data is read from the address just written to and this data is modified to produce a set of modified data. The modified data is then written to another address in the memory. The steps of reading, modifying, and writing modified data back to the memory are repeated until all addresses in the memory have been written to. Thereafter, the data values stored in the memory are compared to a reference list of data values to determine whether the memory contains a detect. In phase two, the steps of phase one are repeated except that the first address in the memory is initialized by writing a set of data which is the complement of the initial set of data used in phase one. Phase two, in effect, complements the contents of each address in the memory to ensure that each cell in the memory is written with both a 0 and a 1. At the end of phase two, the data values stored in the memory are again compared to a list of reference data values to determine whether the memory contains a fault. In phase three, an address in the memory is first selected. Data is then read from the selected address and modified to produce a set of modified data. The modified data is written back to the selected address. The steps of reading, modifying, and writing modified data back to the selected address are repeated a selected number of times. Thereafter, another address in the memory is selected and the process described above is repeated. After all of the addresses in the memory have been selected, the data values stored in the memory are once again compared to a reference list of data values. Using the three-phase test described above, all stuck-at, address uniqueness, address coupling, and bit coupling (within a storage location) faults in the memory are provoked and detected.

9 Claims, 9 Drawing Sheets

METHOD AND APPARATUS FOR TESTING RANDOM ACCESS MEMORY

This is a divisional of copending application Ser. No. 08/130,375 filed on Oct. 1, 1993 pending.

FIELD OF THE INVENTION

The present invention relates generally to very large scale integration (VLSI) chips, and more particularly, to a method and apparatus for testing a random access memory embedded within a VLSI chip.

DESCRIPTION OF THE BACKGROUND ART

Many VLSI chips currently manufactured have one or more random access memories (RAM) embedded within the chip as part of an overall device. The RAM, because it is an integral part of the chip, needs to be tested to determine whether it will function properly. Testing of the RAM may be achieved in one of two ways. The first method involves the use of an external testing device for accessing and manipulating the RAM. Because the RAM is embedded within the chip, it is very difficult for the external testing device to access the RAM. Hence, testing using the external testing method is difficult and inefficient. An alternative testing method involves the use of a built-in self-test (BIST) mechanism which is incorporated into the chip to enable the chip to test its own RAM. Because the BIST mechanism is a part of the chip and, hence, is internal to the chip, it does not experience any difficulties in accessing the RAM. Thus, the BIST mechanism tests the RAM much more effectively and efficiently than the external device. For this reason, many VLSI chips include a BIST mechanism for testing on-chip RAM.

A typical BIST mechanism includes a test pattern generator and a test response evaluator. The test pattern generator generates pseudo-random patterns for the data and addresses and feeds these to the RAM. The test response evaluator, in turn, implements a compaction method (such as signature analysis) to evaluate the output data from the RAM. From the evaluation of the RAM output data, the BIST mechanism determines whether the RAM exhibits any faults.

A shortcoming of the current BIST mechanisms is that they cannot guarantee complete fault coverage for certain RAM fault models. This is due to the fact that, in traditional BIST techniques, fault coverage is estimated through fault simulation. Instead of simulating all possible faults (which is computationally impractical), only a sample of faults is simulated. This means that the fault determination of the BIST mechanism represents only a probability that the RAM is fault free. As with all probabilities, there is a chance that the RAM may have faults despite the fact that it passed the BIST test. For systems which demand high reliability, this possibility of error cannot be tolerated. High reliability systems require a BIST method and apparatus which can guarantee that any instance of certain fault models will be detected. Currently, there is no BIST mechanism believed to be available which can guarantee fault coverage for certain RAM fault models.

SUMMARY OF THE INVENTION

The present invention provides a BIST method and apparatus which guarantees that all stuck-at, address uniqueness, address coupling, and bit coupling (within a particular storage location) faults within a memory are provoked and detected. According to the method of the present invention, a memory is put through three phases of testing. In the first phase, an initial set of data is written to a particular address, preferably the first address, in the memory. Data is read from the address just written to and then modified to produce a set of modified data. The data is preferably modified such that the set of modified data is distinct from any set of data stored in a previous address in the memory. The modified data is thereafter written to another address, preferably the next sequential address, in the memory. The steps of reading data from the address just written to, modifying the data, and writing the modified data to another address are repeated until all addresses in the memory have been written to. Thereafter, the data values stored in the memory are read and compared to a set of reference data values to determine whether the memory exhibits any faults. Since all addresses are accessed and written to in phase one, phase one serves to provoke and detect all address uniqueness faults.

The steps performed in phase two are identical to those carried out in phase one except that, in phase two, the first address in the memory is initialized with a set of data which is the complement of the initial set of data used to initialize the memory in phase one. This subtle change causes each address of the memory to be written with a set of dam which is the complement of the set of data with which it was written in phase one. Hence, phase two in effect complements each storage location in the memory to ensure that each cell in each storage location is written with both a 0 and a 1 value. If any cell is stuck at a particular value, phases one and two will provoke and detect it.

At the end of phase two, each storage location in the memory will have been written with a distinct set of data. In phase three, a particular address of the memory (preferably the first address) is first selected. Data is read from the selected address and modified to produce a modified set of data. This modified data is then written back to the selected address. Thereafter, data is read again from the selected address, the data is modified, and the modified data is again written back to the selected address. This process is repeated a selected number of times with the selected number preferably being equal to the number of storage cells in each storage location. Preferably, at some point during the process of iteratively writing modified data to the selected address, each and every pair of storage cells in the selected address simultaneously experiences opposite binary values. After the above process is repeated the proper number of times, another address is selected and this new address is processed as described above. This process continues until all of the addresses in the memory have been selected. By iteratively reading, modifying, and writing data to a selected address, phase three provokes all address coupling faults and all bit coupling faults within a storage location. The faults provoked, if any, are detected by reading and comparing the data values stored in the memory to a reference list of data values. Together, phases one, two and three serve to provoke and detect all stuck-at, address uniqueness, address coupling, and bit coupling (within a storage location) faults in the memory.

The apparatus of the present invention preferably comprises a data modifier, a comparator, and a controller. The controller is coupled to the memory to selectively send address and control signals to the memory to cause the memory to selectively input and output data. The controller preferably comprises a plurality of counters for generating addresses and a BIST controller. The data modifier, which has an input coupled to an output of the memory, and an output coupled to an input of the memory, receives output data from the memory and processes this data to produce a set of modified data. This modified data is sent to the input port of the memory. The controller, working together with the data modifier, causes data to be read from, and modified data to be written to, the memory to fill the memory with distinct sets of data. Thereafter, the controller causes data to be read out of the memory and sent to the comparator to be compared with a set of reference data values. If the comparator determines that there is a discrepancy between the data from the memory and the reference data, then an error signal is generated to indicate that the memory contains a defect.

DETAILED DESCRIPTION OF THE PREFERRED EMBODIMENTS

Before describing the invention in detail, a brief discussion of the common faults occurring within memories will be provided in order to facilitate a complete understanding of the invention. A typical random access memory comprises a plurality of storage locations, each storage location having a unique address and a plurality of storage cells. Ideally, each address should be uniquely addressable, each storage cell should be capable of storing both a 0 and a 1, and each storage cell should operate independently of the other storage cells. However, due to manufacturing imperfections, some memories will contain defects. Usually, these defects manifest themselves in the form of one or more fault conditions.

A first common fault condition is the stuck-at fault. Stuck-at faults occur when a storage cell is frozen at a particular data value. No matter what data is written into the cell, the cell always exhibits the same data value. Another common fault condition is the address uniqueness fault. This fault condition arises when one or more of the addresses in the memory cannot be accessed. Address uniqueness faults are normally caused by one or more of the memory's decoder outputs being stuck at a particular value. A third common fault condition is the address coupling fault. The result of such a fault is that accessing one address causes another address to also be accessed. A fourth common fault condition is the bit coupling fault. For a memory having this fault condition, changing a data value in one storage cell affects the data value in another storage cell. These four fault conditions are the most common manifestations of memory defects. The present invention provides a method and apparatus for testing a memory which provokes and detects all stuck-at faults, all address uniqueness faults, all address coupling faults, and all bit coupling faults within a particular storage location.

According to the method of the present invention, a memory is tested in three phases. In phases one and two, data is iteratively read from one address, modified, and written to another address to provoke and detect all stuck-at and address uniqueness faults. In phase three, data is iteratively read from each address, modified, and written back to the same address to provoke and detect all address coupling faults and all bit coupling faults within a particular storage location. Together, these three phases provide a thorough test for verifying the accuracy and integrity of the memory.

Figure 1:
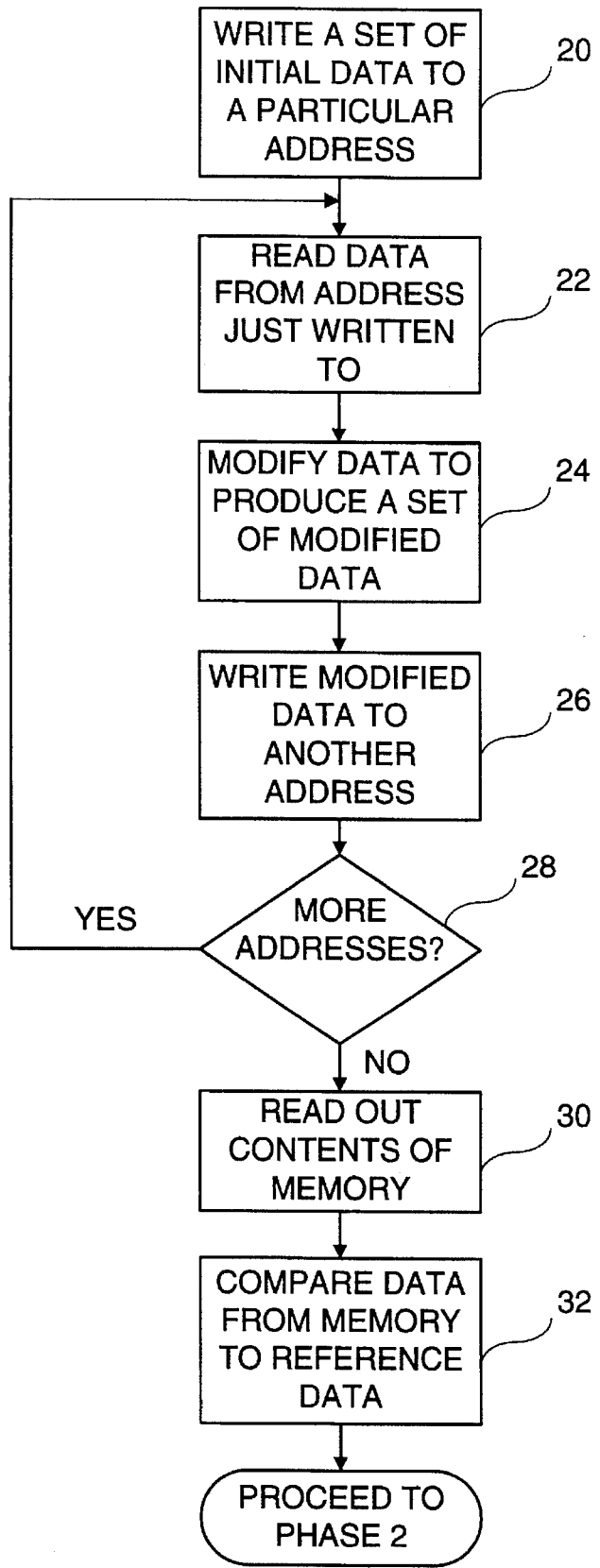
FIG. 1 is a flow diagram of the first phase of the method of the present invention.

With reference to FIG. 1, the method of the present invention will now be described in greater detail. FIG. 1 shows a flow diagram of the first phase of the inventive method. As shown in FIG. 1, a memory is tested by first writing 20 a set of initial data to a particular storage location in the memory. This step is preferably carried out by writing 0x1 into the first address in the memory. The "x" is used here to represent a variable number of 0's. If each storage location in the memory has eight storage cells, then the "x" represents six 0's. If each storage location has eighteen storage cells, then the "x" represents sixteen 0's, and so forth.

After the initial data is written, data is read 22 from the address which was just written to, namely, the first address. This data is then modified 24 to produce a set of modified data. Preferably, the data is modified by passing it through a "magic" function. This magic function has several important properties. One important property is that the magic function ensures the modified data produced is distinct from any set of data stored in a previous address in the memory. As will be explained later, this property plays an important role in facilitating the detection of faults. Other properties of the magic function will be disclosed and explained in subsequent sections.

After the data from the first address is modified, the set of modified data is written 26 to another address in the memory, preferably the next address. Thereafter, it is determined 28 whether more addresses remain in the memory to be written. If so, steps 22, 24, 26, and 28 are repeated to again read data from the address just written to, modify the data, and write the modified data to another address. This iterative process continues until all addresses in the memory have been written to. At the end of this process, if the memory has no defects, each memory location in the memory has a distinct set of dam. This is due to the fact that the magic function ensures that each set of modified data written into the memory is distinct from any set of data stored in a previous address in the memory. The magic function guarantees data distinctiveness among the memory locations if the memory is a $2^k \times n$ memory ($2^k$ memory locations, each location having n bits or storage cells) and n is greater than k. This condition is satisfied by most memories. After the memory is fully written with data, the contents of the memory are read out 30 and compared 32 to a set of reference data values. The set of reference values represents the data values which should be stored in the memory if the memory is free of defects. Any deviation from the reference values indicates a defect.

Figure 2:
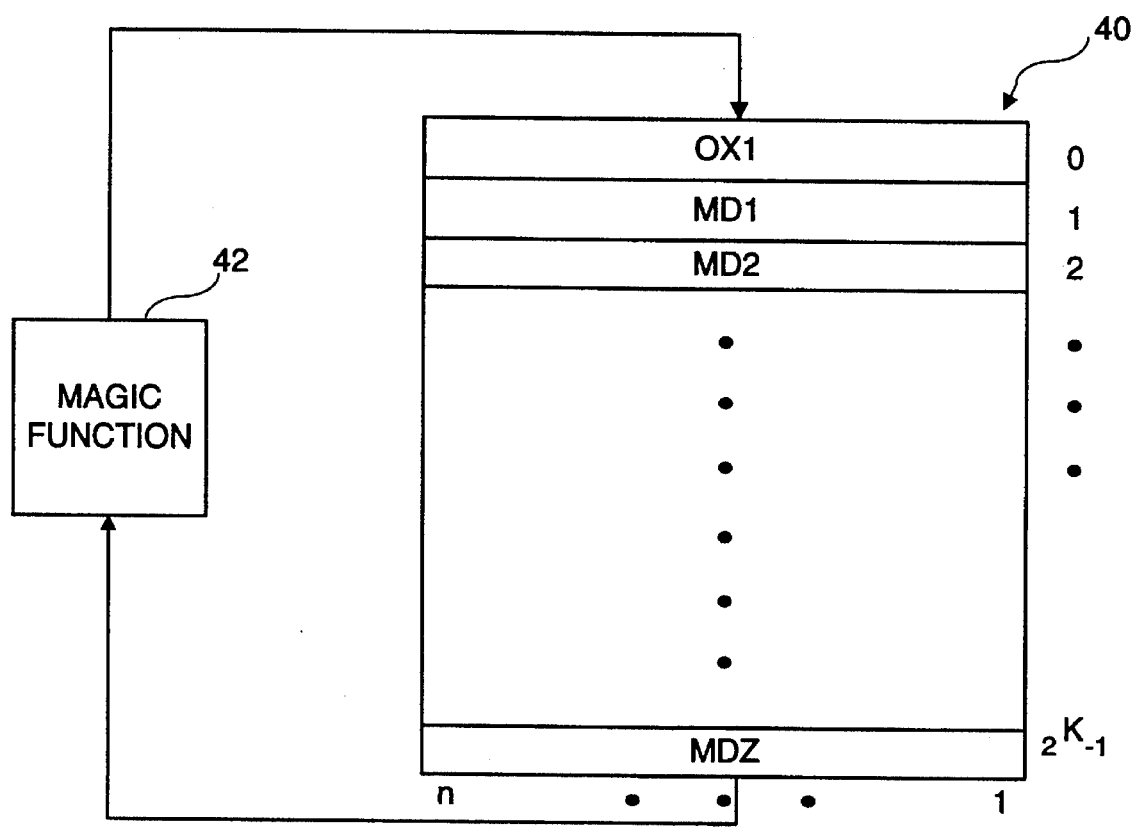
FIG. 2 is a block diagram of a test memory 40 and a magic function 42 to illustrate the sequence of operation of phase one of the method of the present invention.

Phase one serves to provoke and detect all address uniqueness faults and some stuck-at faults. To illustrate this more clearly, reference is made to FIG. 2, which shows a block diagram of a test memory 40 having addresses 0 to $2^k-1$ and n bits, and a magic function 42. According to phase one, an initial set of data (0×1) is written to the first address in memory. Hence, in address 0 of memory 40, there is stored a set of data having the value of 0×1. The data stored in address 0 is then read and sent to the magic function 42 to be modified. The modified data $MD_1$ from the magic function 42 is thereafter written into the next address of the memory 40, namely, address 1. The data in address 1 is then read and outputted to the magic function, which modifies the data to produce another set of modified data $MD_2$. $MD_2$ is then written into address 2 of the memory. This process repeats until modified data $MD_z$ is written into address $2^k-1$. Note that the data in each subsequent address is determined based upon the data read out of the previous address. This means that if a previous memory location contains a fault, this fault will be reflected in the data of subsequent memory locations. By checking the values stored in the memory, the fault can be detected.

To illustrate how phase one detects address uniqueness faults, suppose that address 1 is inaccessible. This means that $MD_1$ cannot be written into, nor can it be read from, address 1. Hence, when an attempt is made to read from address 1, the data at the output of the memory 40 will not be equal to $MD_1$. Since it is this erroneous output data which is modified and the modified data written into address 2, the data $MD_2$ in address 2 will not have the proper data value. Since $MD_2$ is in turn used to generate $MD_3$, $MD_3$ will also contain an incorrect data value. In fact, all subsequent memory locations will contain erroneous data values. Hence, this one address uniqueness fault taints the data in the remainder of the memory locations. By checking the data stored in the memory. 40, this address uniqueness fault can be easily detected.

A stuck-at fault can be detected in a similar fashion. Suppose, for example, that 0×1 is written into address 0 but that, due to a stuck-at fault. 0×0 is the data actually stored at address 0. When data is read from address 0, data value 0×0 will be outputted and sent to the magic function 42. Using this incorrect data, magic function 42 produces modified data $MD_1$, which is written into address 1. Since magic function 42 uses the erroneous data to generate $MD_1$, $MD_1$ will have an incorrect data value. The data stored in subsequent storage locations will also have incorrect data values. Thus, the stuck-at fault can be detected by comparing the data stored in the memory to a set of reference data values.

Phase one serves to provoke and detect all address uniqueness faults, but it only provokes half of the stuck-at faults. This is because each storage cell has only been written with one value, a 0 or a 1. To provoke and detect all stuck-at faults, it is necessary to write each storage cell with both a 0 and a 1 to determine whether the storage cell is capable of storing both values. Phase two of the inventive method serves to provoke and detect the stuck-at faults left untested by phase one.

Figure 3:
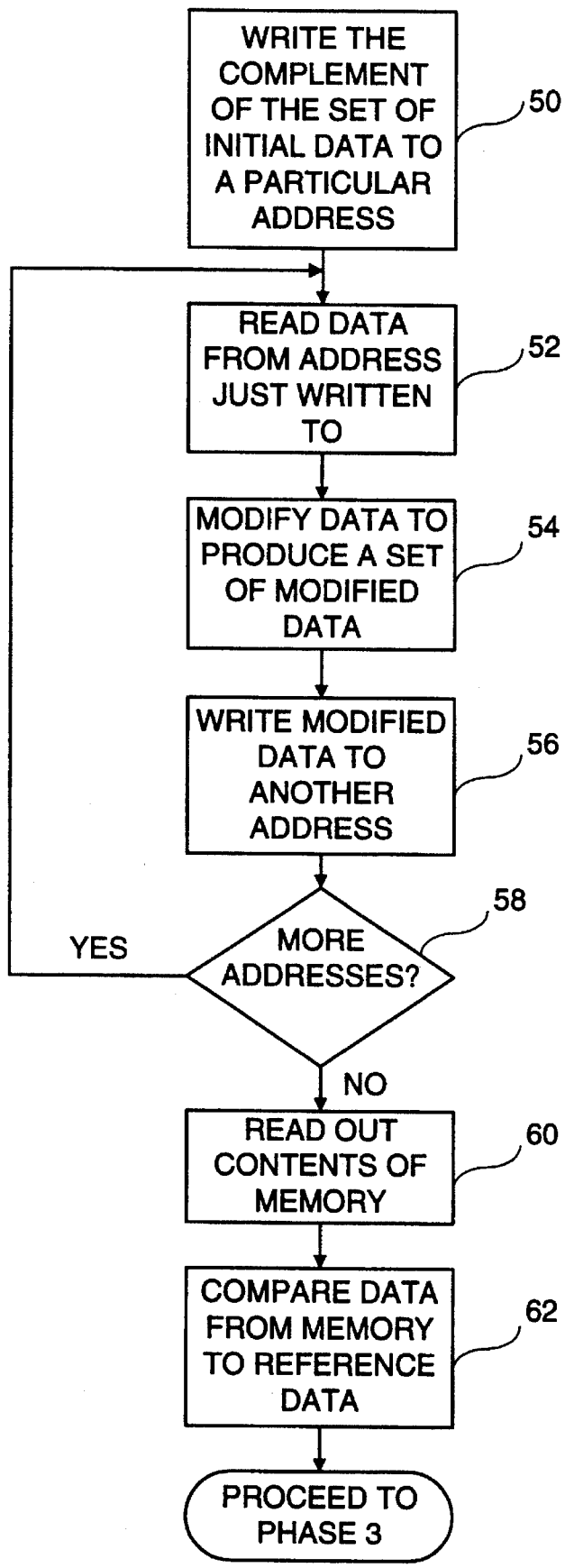
FIG. 3 is a flow diagram of the second phase of the method of the present invention.

Referring to FIG. 3, there is shown a flow diagram of phase two of the method of the present invention. A brief review of FIG. 3 will reveal that substantially the same steps are performed in phase two as in phase one. The only difference is that in phase two, the complement of the initial set of data used in phase one is written 50 to a particular address in the memory. This set of complementary data is preferably written to the same address as that to which the initial set of data was written in phase one. Hence, in step 50 of phase 2, the complement of 0×1(~(0×1)) is preferably written to the first address in the memory. Thereafter, data is read 52 from the address just written to, the data is modified 54 by the magic function to produce a set of modified data, and the modified data is written 56 to another address in the memory, preferably the next address. It is then determined 58 whether other addresses remain in the memory to be written. If so, steps 52, 54, 56, and 58 are repeated until all addresses in the memory, have been written to. Thereafter, the contents of the memory are read out 60 and compared 62 to a set of reference data values to determine whether the memory contains erroneous data. If so, a defect in the memory is indicated.

The purpose of phase 2 is to write into each storage location in the memory the complement of the set of data written into the storage location in phase one. In effect, phase two complements the data stored in the memory. At the end of phase 2, if the memory contains no defects, each storage location in the memory has a distinct set of data, and each set of data is the complement of the set of data previously written into the storage location in phase one. In this manner, each storage cell is forced to store both a 0 and a 1 value. If any cell is stuck-at a particular data value, phases one and two will provoke and detect this defect.

It should be noted here that, preferably, the same magic function is used in both phases one and two to modify data read from the memory. Since the purpose of phase two is to complement the data generated in phase one, the magic function preferably has the following additional property: Given the complement of the set of initial data used in phase one, the magic function is capable of generating a sequence of data which is complementary to the sequence of data generated in phase one. That is, given the complement of 0×1, the magic function 42 generates a sequence of data wherein each set of data in the sequence is complementary to a corresponding set of data generated by steps 42–48 (FIG. 1) of phase one. This property allows the same magic function to be used in both phases, and this, in turn, simplifies implementation of the inventive method.

Figure 4:
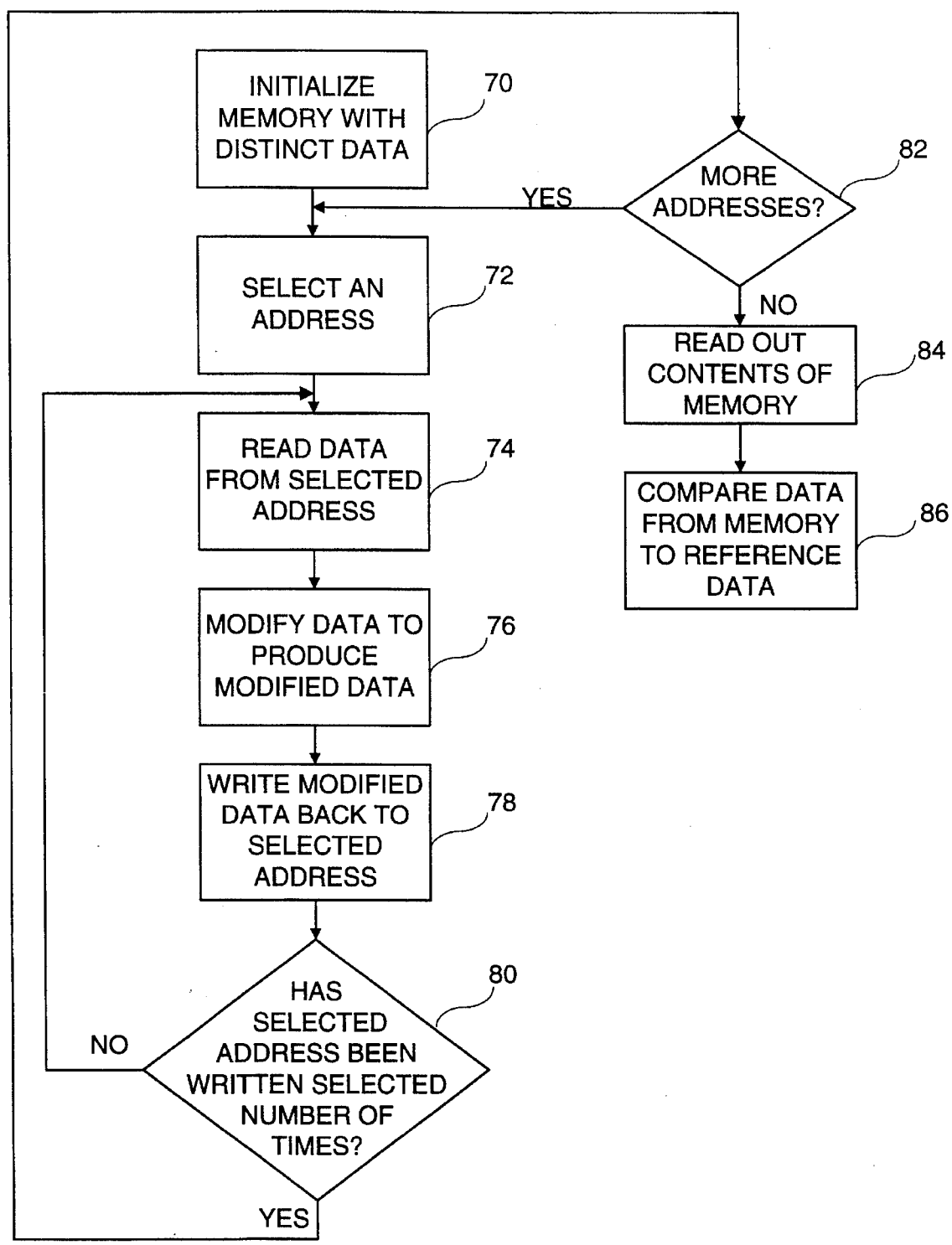
FIG. 4 is a flow diagram of the third phase of the method of the present invention.

After phase two is completed, the inventive method proceeds on to phase three. With reference to FIG. 4, there is shown a flow diagram of phase three of the inventive method, wherein the first step is to initialize 70 the memory with distinct data. This is preferably achieved by writing a distinct set of data into each storage location. Recall that the magic function ensures (if no faults are encountered) that each set of modified data written into the memory is distinct from any set of data written into a previous storage location. Thus, if phase three is carried out immediately after phase two (as is preferred), and if no faults are encountered in phases one and two, then each storage location in the memory will already contain a distinct set of data. Thus, step 70 may not need to be performed.

After the memory is initialized, phase three enters into a first loop, wherein an address in the memory is selected 72. This selected address is preferably the first address in the memory. Thereafter, a second loop is entered to read 74 data from the selected address, to modify 76 the data to produce a set of modified data, and to write 78 the modified data back into the selected address. Preferably, the data from the selected address is modified by passing the data through the same magic function as in phases one and two. After the modified data is written back to the selected address, it is determined 80 whether steps 74–78 have been performed a selected number of times. If not, steps 74–78 are repeated. Preferably, steps 74–78 are performed an n number of times where n represents the number of storage cells in each storage location. After nested loop 74–80 has been executed, it is determined 82 whether more addresses remain in the memory to be processed. If so, another address, preferably the next sequential address in the memory, is selected 72 and this newly selected address is processed by the nested loop 74–80 as described above. Steps 72–82 are repeated until all addresses in the memory have been selected and processed. Thereafter, the contents of the memory are read out 84 and compared 86 to a set of reference data. If there is any discrepancy between the stored data and the reference data, then a memory defect is indicated.

As mentioned above, the data from the selected address is modified using the same magic function as in phases one and two. In order to provoke and detect all address coupling faults and bit coupling faults within a storage location, the magic function preferably has the following additional properties: (1) the magic function ensures that the last set of data written into each selected address is distinct from any set of data stored in a previous address; and (2) the magic function ensures that, at some point during the execution of nested loop 74–80, each and every pair of storage cells in the selected address simultaneously experiences opposite binary values.

Additional property (1) guarantees (if no faults are encountered) that the data stored in each storage location of the memory is distinct. This property is important when it comes time to detect the possible faults. To illustrate this point, suppose that each memory location does not contain a distinct set of data, but that locations 1 and 5 contain the same data. When it comes time to check the contents of the memory, both locations will output the same data. However, there is always uncertainty as to whether the data came from location 1 or location 5. It is possible that an address coupling fault exists between the two memory locations which causes location 5 to be accessed when the address for location 1 is fed to the memory. If such a fault exists, it will go undetected. Consequently, in order to guarantee that all address coupling faults are detected, the magic function preferably ensures data distinctiveness among the various memory locations.

To illustrate that phase three provokes and detects all address coupling faults, suppose that writing data to address 1 changes the data in address 3 so that address 3 now contains incorrect data. After addresses 1 and 2 are processed, address 3 is selected. In accordance with steps 74–78, data is read from address 3, the data is modified, and the modified data is written back to address 3. Because address 3 is first read from and then written to, the change in the data caused by the address coupling fault is preserved. Since this incorrect data is used to produce the modified data which is written back to address 3, the data stored in address 3 will reflect the error. Thus, when the contents of address 3 are later compared to a corresponding reference data value, the address coupling fault will be detected.

Suppose instead that writing data to address 3 changes the data in address 1. Such a fault will also be detected. Assuming that address 1 is processed prior to address 3, the data change caused by the address coupling fault is preserved in address 1 throughout phase three. When the contents of address 1 are eventually compared to a corresponding reference data value, the change in data will be detected. Hence, the address coupling fault is exposed. Therefore, phase three provokes and detects all address coupling faults.

Additional property. (2) plays an important role in provoking all bit coupling faults. To elaborate, when two storage cells are bit coupled, a binary value written into one cell is also stored in another cell. Hence, if two cells are bit coupled, they must store the same binary value. Since property (2) guarantees that at some point during phase three, each and every pair of cells in the selected address will simultaneously experience opposite binary values, there will come a time when the bit coupled storage cells must take on different values. Since the cells are incapable of storing different binary values, the bit coupling fault will manifest itself in the form of incorrectly stored data. This incorrect data will alter the data sequence generated by the magic function, and this data alteration will, in turn, be detected when the contents of the memory are compared to the set of reference data. Thus, any and all bit coupling faults within a single storage location are provoked and detected by phase three. Together, phases one, two, and three provide a thorough test for verifying the accuracy and integrity of a memory.

Figure 5:
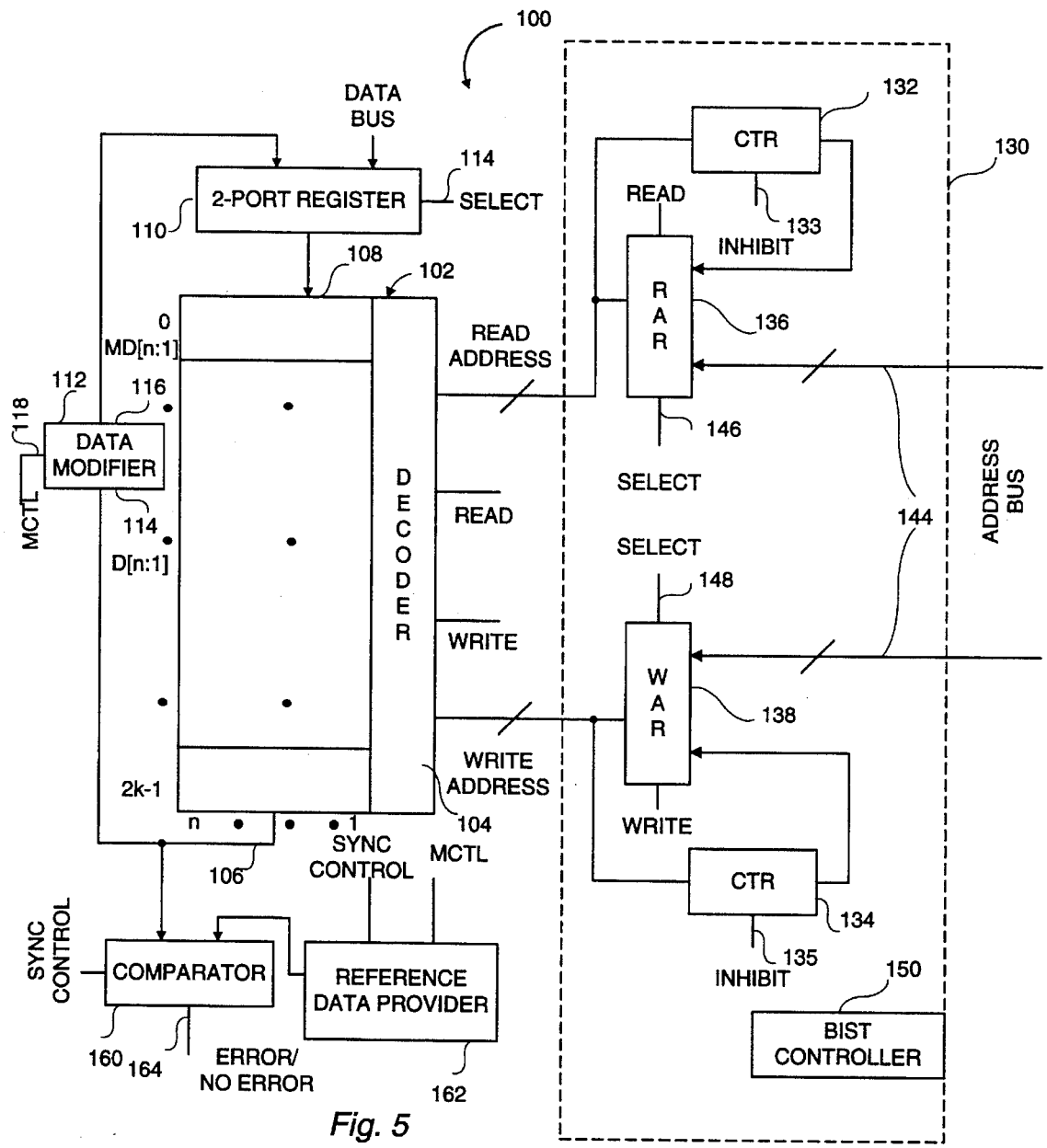
FIG. 5 is a block diagram representation of a system for implementing the method of the present invention.

With reference to FIG. 5, there is shown a system 100 wherein the method of the present invention is implemented. System 100 is preferably incorporated into a VLSI chip (not shown) as part of an overall device to allow the chip to self-test the on-chip memory 102. The memory 102 to be tested preferably is a read/write memory having $2^k$ storage locations, each storage location having a unique address and n storage cells. As mentioned previously, the magic function ensures data distinctiveness among the various storage locations if n>k. For this reason, n is preferably greater than k for memory 102. Memory 102 also preferably comprises a decoder 104 for receiving and decoding address and read/write control signals, an output port 106 for outputting data from the memory 102, and an input port 108 for receiving data to be stored within the memory 102.

Note that input port 108 is coupled to the output of a 2-port data register 110 which, in turn, has its inputs coupled to a data bus and the output from the data modifier 112. Register 110 is included in system 100 to accommodate operation in both the standard and the self-test mode. In standard operation, memory 102 receives data from other components on the chip (not shown). Hence, the input port 108 should receive data from the chip's data bus. In self-test mode, however, memory 102 receives data from the data modifier 112. To accommodate both operational modes, register 110 receives data from both the data bus and the data modifier 112 but sends only one of the two sets of input data to the input port 108. The select control signal 114 determines which set of input data is sent to the input port 108 of the memory 102.

The component in system 100 responsible for carrying out the magic function described above is the data modifier 112. Data modifier 112 has a data input port 114 coupled to the output 106 of the memory 102 for receiving data D[n:1] therefrom, and a data output port 116 coupled to register 110 for outputting modified data MD[n:1] thereto. Modifier 112 also has a control input port 118 for receiving a complementary control signal MCTL. The MCTL signal determines the operational mode of modifier 112. If MCTL is set to logic 0, modifier 112 operates in regular mode to generate a particular data sequence using 0×1 as the initial set of data. If MCTL is set to logic 1, modifier 112 operates in the complementary mode to generate, using ~(0×1) as the initial set of data, a data sequence which is complementary to the data sequence generated in regular mode. These two modes ensure that each set of data generated is complemented to provoke all stuck-at faults in the memory 102.

Because data modifier 112 is responsible for carrying out the magic function, the modifying function performed by modifier 112 preferably has the properties articulated above for the magic function. While all modifying functions have the same general properties, the specific implementation of a modifying function will depend upon the dimensions of the particular memory tested. Several examples of modifying functions are provided below for specific memories.

Denoting input data to the modifier 112 as D[n:1] and modified data from the modifier 112 as MD[n:1], the modifying function for a $2^{10} \times 18$ memory is as follows:

for all i: MD[i]=D[i−1]; except

MD[8]=D[7]^D[18]^MCTL, where ^ denotes an exclusive OR (XOR) operation.

Figure 6:
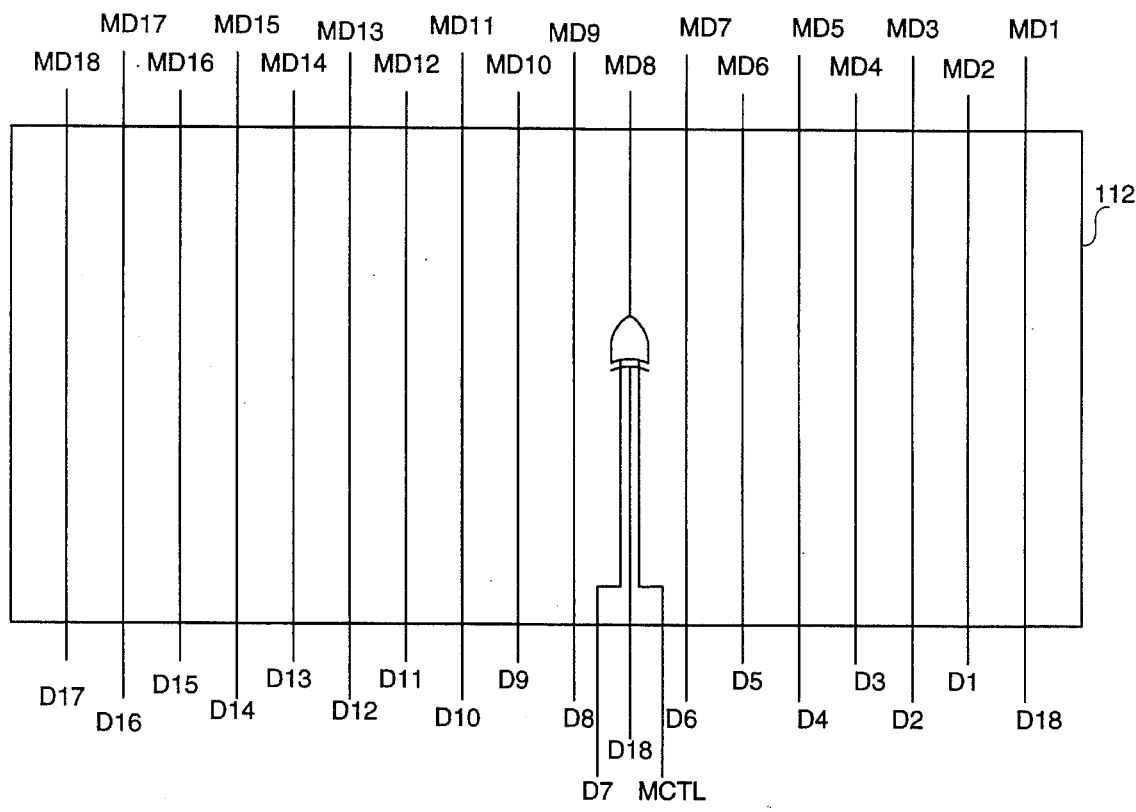
FIG. 6 is a circuit diagram of a specific implementation of the data modifier 112 of FIG. 5.

A possible implementation of this modifying function is shown in FIG. 6. Note that the implementation of modifier 112 includes only one XOR gate 120 and a plurality of wires. Most of the modified data bits MD[n:1] are derived directly from one of the input data bits D[n:1]. The only bit which requires a logic gate to generate is bit MD[8]. Note that gate 120 receives the MCTL signal as one of its inputs. This means that the value of bit MD[8] is a function of the complementary control signal MCTL. For the modifier 112 shown in FIG. 6, MD[8] is the only bit whose value is a function of MCTL. While the effect of MCTL on the modified data is subtle, this effect is sufficient to cause modifier 112 to generate a complementary data sequence using ~(0×1) as the initial set of data.

As a further example, the modifying function for a $2^9 \times 44$ memory is as follows:

for all i: MD[i]=D[i−1]; except

MD[28]=D[27]^D[44]^MCTL;

MD[27]=D[26]^D[44]^MCTL;

MD[2]=D[1]^D[44]^MCTL; and

MD[1]=D[44].

The modifying function for a $2^8 \times 56$ memory is:

for all i: MD[i]=D[i−1]; except

MD[23]=D[22]^D[56]^MCTL;

MD[22]=D[21]^D[56]^MCTL;

MD[2]=D[1]^D[56]^MCTL; and

MD[1]=D[56].

The modifying function for a $2^4 \times 64$ memory or a $2^7 \times 64$ memory is:

for all i: MD[i]=D[i−1]; except

MD[5]=D[4]^D[64]^MCTL;

MD[4]=D[3]^D[64]^MCTL;

MD[2]=D[1]^D[64]^MCTL; and

MD[1]=D[64].

The modifying function for a $2^6 \times 72$ memory is:

for all i: MD[i]=D[i−1]; except

MD[54]=D[53]^D[72]^MCTL;

MD[48]=D[47]^D[72]^MCTL;

MD[7]=D[6]^D[72]^MCTL; and

MD[1]=D[72].

These modifying functions may be implemented in substantially the same manner as that shown in FIG. 6 using direct connections and XOR gates. Note that even for memories having a large number of output bits, the modifying functions are rather simple. This means that the implementations of the modifying functions are likewise simple. By keeping implementation of modifier 112 simple, costs are reduced and testing speed is increased. This is one of the major advantages of the present invention.

Referring again to FIG. 5, system 100 further comprises a comparator 160 and a reference data provider 162. Comparator 160 has a first data input port coupled to receive data from the output 106 of memory 102, and a second data input port coupled to receive reference data from data provider 162. Comparator 102 compares the two sets of input data, and if they are not equivalent, an error signal is generated at the output 164 of the comparator 160. Preferably, the output 164 of comparator 160 is error latched so that, if any discrepancy is detected between a set of reference data and a set of data from the memory 102, the output 164 remains at the error state regardless of the result of subsequent comparisons. Comparator 160 preferably further has a control port for receiving a sync control signal. The sync control signal synchronizes the operation of the comparator 160 and the data provider 162 to ensure that the proper set of reference data is compared to the proper set of data from the memory 102.

In the preferred embodiment, reference data provider 162 takes the form of a data generator which is substantially identical in structure to the data modifier 112. The modifying function carried out by data generator 162 is the same as that performed by data modifier 112. However, unlike data modifier 112 which repeatedly reads, modifies, and writes data to memory 102, data generator 162 generates data by using data from its own output. Hence, generator 162 is unaffected by memory errors. Consequently, the data sequence generated by generator 162 represents the ideal or reference data sequence, i.e. the data sequence which would be generated by data modifier 112 if memory, 102 has no defects. Since generator 162 is structurally similar to data modifier 112, generator 162 preferably also receives the MCTL control signal. The MCTL signal allows the generator 162 to determine if and when a complementary data sequence should be generated. Like comparator 160, data generator 162 also receives the sync control signal. This control signal synchronizes the generation of reference data with the reading of data from memory 102 to ensure that the proper data sets are compared.

While reference data provider 162 has been described as being a data generator, it should be noted that other embodiments are possible. For example, a memory table may be used in place of the data generator. Each entry in the table may represent a particular set of reference data and each entry may be read out and compared to the data read from the memory 102 to determine whether the data from the memory 102 contains an error. This and other alternate embodiments for data provider 162 are contemplated by the present invention.

The controller 130 of system 100 is the component which controls the various elements in the system 100 to implement the method of the present invention. Controller 130 preferably comprises counters 132, 134 for generating memory addresses, a 2-port read address register (RAR) 136, a 2-port write address register (WAR) 138, and a BIST controller 150. Like register 110, 2-port registers 136 and 138 are utilized in controller 130 to support operation in both standard and self-test modes. In standard mode, the memory 102 should receive addresses from the on-chip address bus 144. Accordingly, in standard mode, registers 136, 138 pass the addresses from bus 144 on to the address lines of the memory 102. In self-test mode, however, the memory should receive addresses from the counters 132, 134. Thus, registers 136, 138, in self-test mode, send the self-test addresses received from counters 132, 134 to the address lines of the memory 102. The operational mode of the registers 136, 138 is controlled by the select control signals 146, 148. In addition to receiving select signals 146, 148, registers 136, 138 also receive read and write control signals. These control signals act as enable signals to activate the registers 136, 138 to allow them to send addresses to the address lines of the memory 102.

The read address counter 132 and the write address counter 134 serve to generate the read and write addresses necessary for properly accessing the memory 102. Counters 132, 134 are preferably linear feedback counters programmed to implement a full cycle count. The cycle count of each counter preferably ranges from 0 to $2^k-1$ so that each address of the memory 102 can be generated. At the end of a full cycle, each counter automatically resets to 0. Counters 132, 134 are considered linear feedback counters because the output of each counter is fed back (through the address registers 136, 138) to an input of the counter. Each time an output is fed back to the input, the counter increments its count. Hence, counters 132, 134 are self-incrementing counters. Preferably, each counter 132, 134 further comprises a control input port for receiving an inhibit signal 133, 135. When the inhibit signal is unasserted, the counter functions normally, incrementing its count each time a feedback signal is received at the input. If the inhibit signal is asserted, however, the counter is inhibited from receiving the feedback signal. If the feedback signal is not received, then the count is not incremented. Consequently, the inhibit signal may be used to prevent the counters 132, 134 from incrementing.

The BIST controller 150 is the component which controls the operation of the overall system 100. In the preferred embodiment, BIST controller 150 takes the form of a finite state machine implemented using combinational logic. However, it should be noted that BIST controller 150 may be implemented in various other forms, including that of a processor running a software program.

Figure 7A:
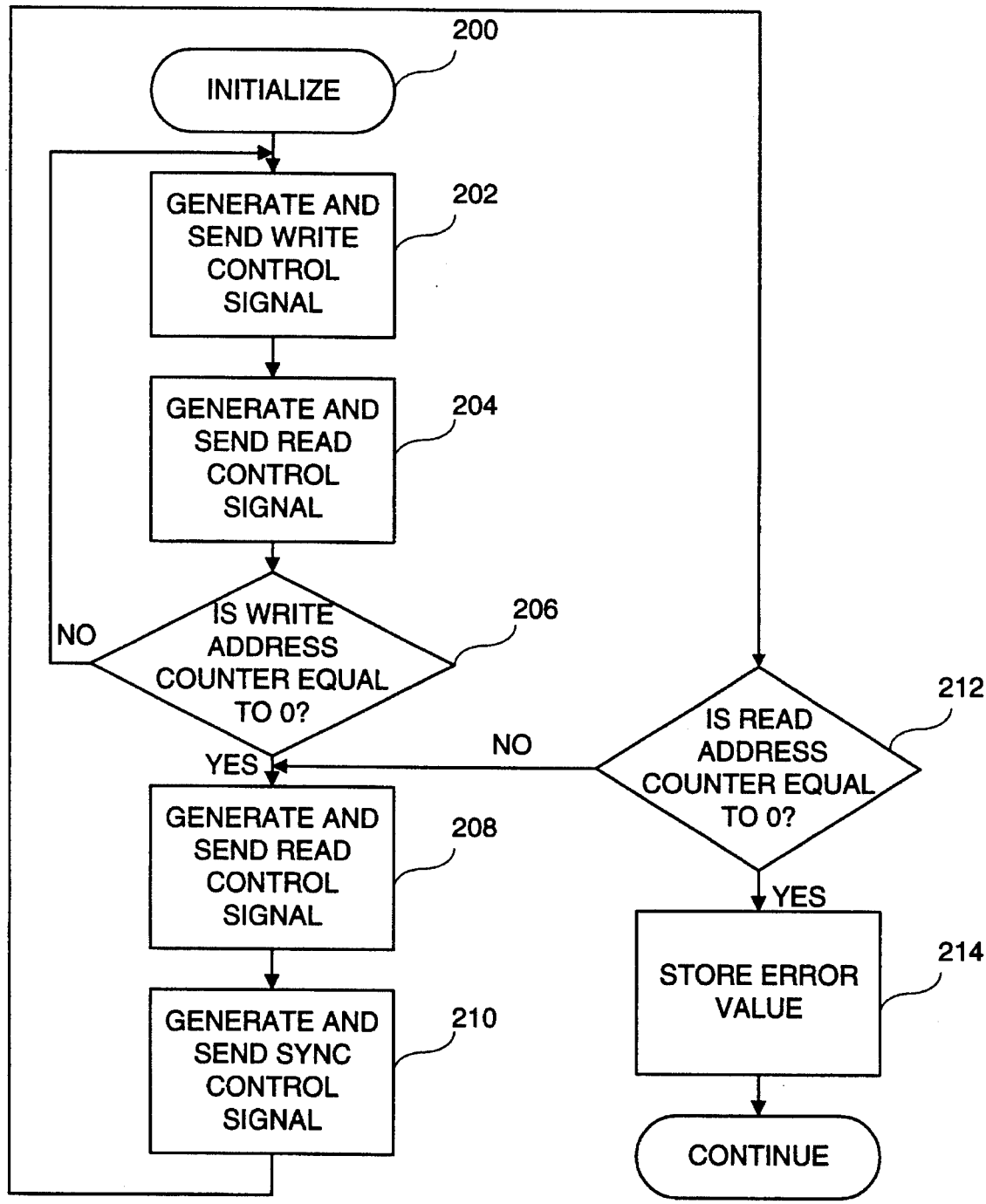
FIG. 7A is a flow diagram of the sequence of operation of BIST controller 150 during phase one of the method of the present invention.
Figure 7B:
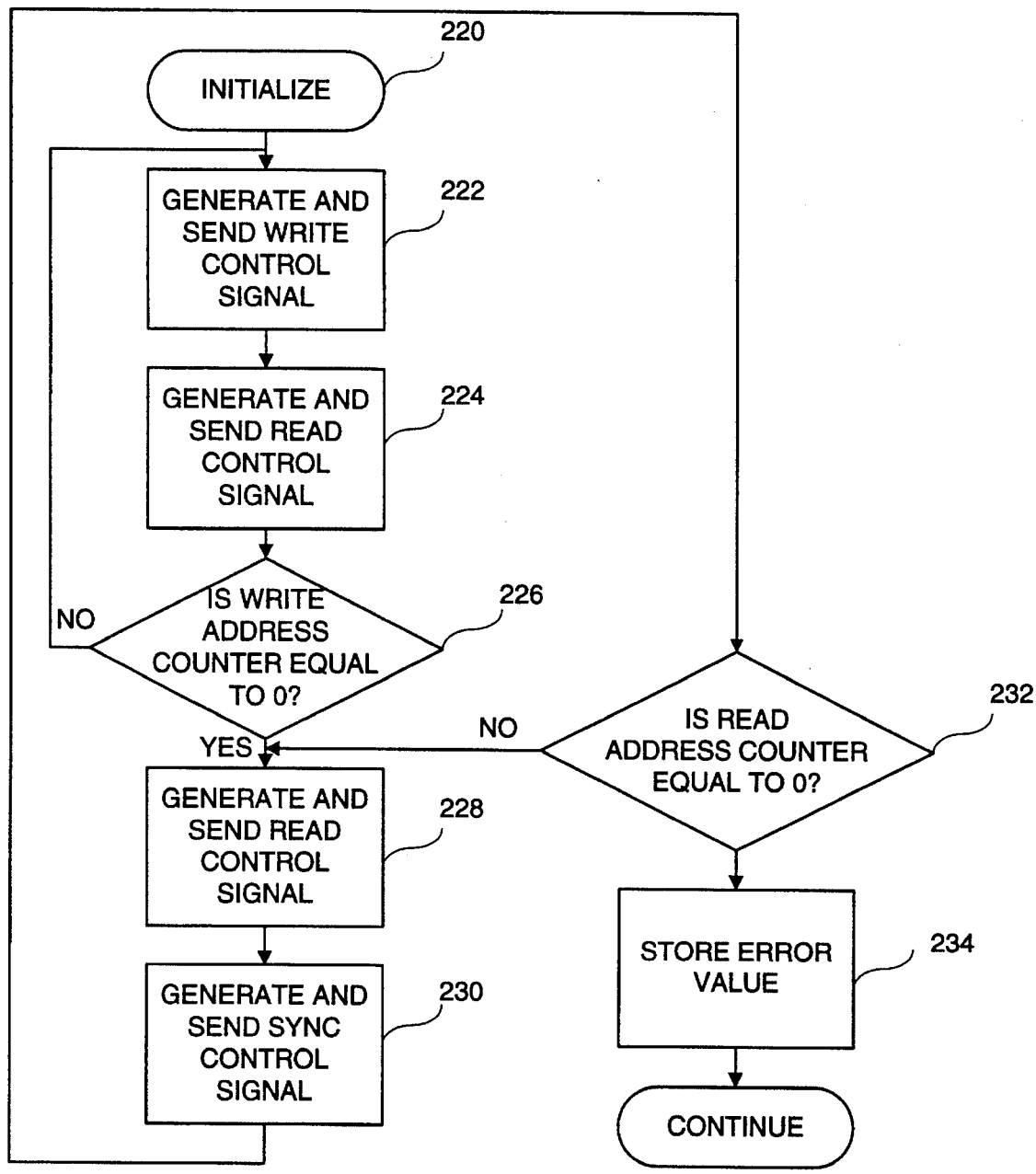
FIG. 7B is a flow diagram of the sequence of operation of BIST controller 150 during phase two of the method of the present invention.
Figure 7C:
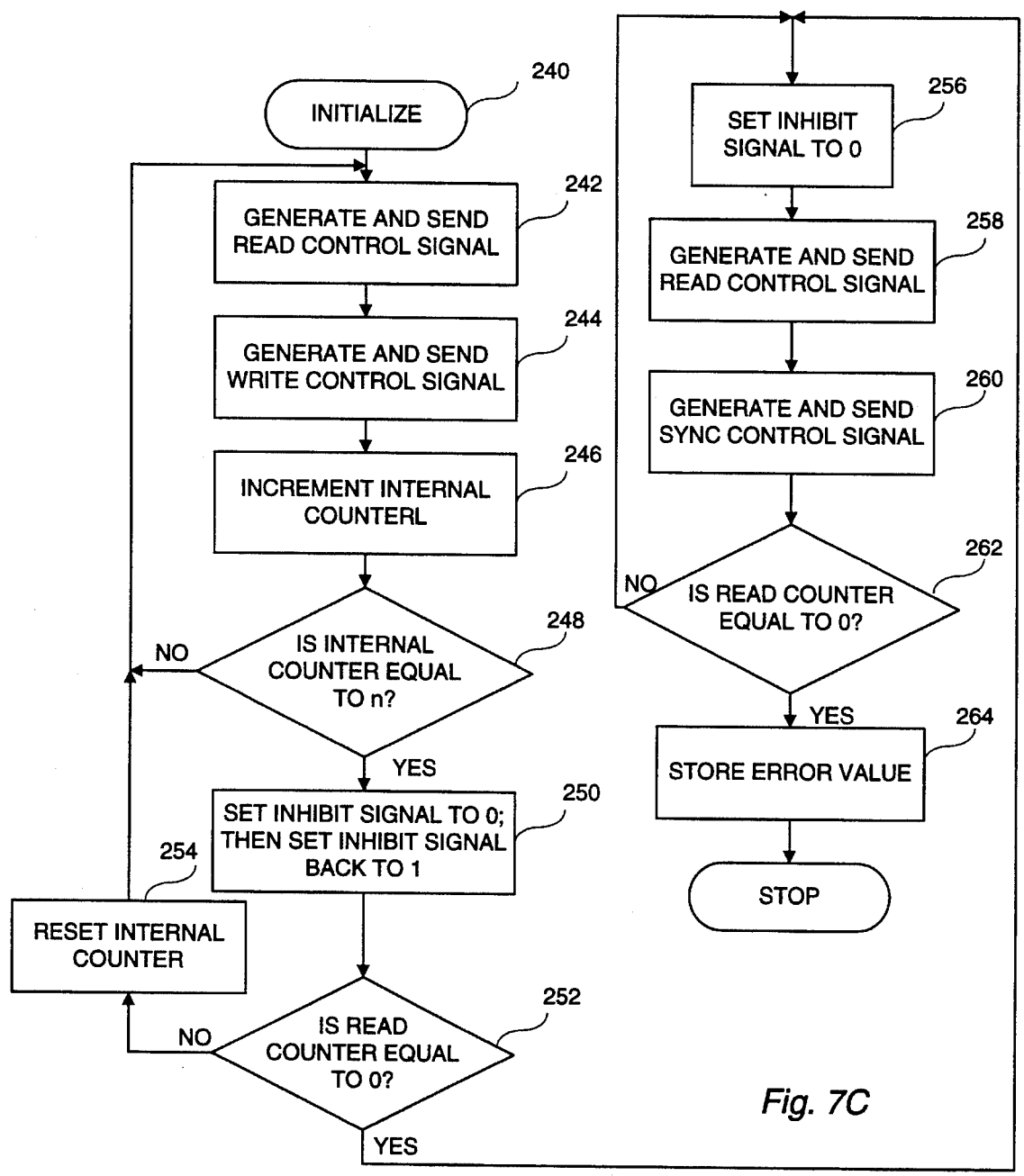
FIG. 7C is a flow diagram of the sequence of operation of BIST controller 150 during phase three of the method of the present invention.

The function of the BIST controller 150 is to coordinate the interaction among the various components in the system 100 to implement the method of the present invention. With reference to FIGS. 7A–7C, there is shown a flow diagram to illustrate the operational sequence of the BIST controller 150. Since the inventive method is divided into three phases, the operational sequence of BIST controller 150 is also divided into three phases. The first, second, and third phases of operation of BIST controller 150 are illustrated in FIGS. 7A, 7B and 7C, respectively.

With reference to FIG. 7A, BIST controller 150 begins fast phase testing by initializing 200 the various components in system 100. In step 200, controller 150 causes register 110 and reference data generator 162 to be initialized with the data set 0×1, and causes counters 132, 134 to be reset to 0×0. These initial values are preferably written into the designated components by using known scan techniques. In addition, controller 150 sets the MCTL control signal to 0 to put the data modifier 112 and data generator 162 into standard mode, and sets the inhibit signals 133, 135 to 0 to allow the counters 132, 134 to self-increment. Furthermore, controller 150 sets the select control signals 114, 146, 148 to 0 to put the registers 110, 136, 138 into self-test mode. The MCTL, inhibit, and select control signals are preferably maintained at these initial values throughout phase one. After initialization, system 100 is ready to self-test.

BIST controller 150 begins self-testing by generating and sending 202 a write control signal to the WAR 138 (FIG. 5) and to the memory 102. This write control signal serves two purposes. First, it acts as an enable signal for the WAR 138 to cause the register 138 to output the address received from counter 134. This address is sent to the memory 102 as the write address, and fed back to counter 134 to increment the counter. Second, the write control signal causes the memory 102 to write the set of data stored in register 110 into the address received on the write address lines. The result of step 202 is that the data (0×1) stored in register 110 is written into the self-test address (0×0) received from the counter 134.

Thereafter, data should be read from the address just written to. To accomplish this, controller 150 generates and sends 204 a read control signal to the RAR 136 and to the memory 102. This read control signal causes the RAR 136 to output the address received from counter 132 to the memory 102 and to the input of counter 132, thereby incrementing the counter 132. The read control signal also causes the memory 102 to output data from the address indicated on the read address lines. In effect, data is read out of the address (0×0) to which data was just written. The data read out of memory 102 is received by data modifier 112 (FIG. 5) and in response, the modifier 112 produces a set of modified data at its output 116. This modified data is sent to register 110 and stored therein. The modified data is now ready to be written into an address in the memory 102.

After step 204, controller 150 checks 206 the write address counter 134 to determine whether the counter 134 has a count equal to 0×0. If it does not, controller 150 loops back to step 202 to write another set of data into the memory and to read another set of data out of the memory. Since counters 132, 134 increment automatically, data will be written into and read out of the next address in the memory 102. In this iterative manner, modified data sets are continuously written into, and read out of, memory 102 to fill the memory with data. When all addresses in memory 102 have been written to, counter 134 will have a count of 0×0 because a full cycle will have been completed. In such an instance, controller 150 exits loop 202, 204, 206 and proceeds to step 208 to test the contents of the memory 102.

The purpose of loop 208, 210, 212 is to read out data from each address in the memory 102 and to compare each set of data to a reference set of data. Controller 150 begins the comparison process by generating and sending 208 a read control signal to memory 102 and to RAR 136. This read control signal causes the RAR 136 to send the read address received from counter 132 to the memory 102 and to the input of counter 132, thus incrementing the counter 132. The read control signal also causes the memory 102 to output data from the address indicated on the read address lines. After data is read out of memory 102, the data is sent to the comparator 160 where it is compared to a reference data value from data provider 162. To synchronize the operation of comparator 160 and data provider 162, controller 150 generates and sends 210 a sync control signal to both components. Thereafter, controller 150 checks 212 the read address counter 132 for a 0×0 count. If the count is not equal to 0×0, controller 150 loops back to step 208 to generate another read control signal. But if the count is equal to 0×0, then it means that counter 132 has made a full cycle and that all addresses in memory 102 have been read. In such a case, controller 150 stores 214 the value of the error signal 164 from comparator 160, resets the error signal, and proceeds to phase two.

With reference to FIG. 7B, controller 150 begins phase two operation by again initializing 220 the system 100. Controller 150 achieves this by first causing ~(0×1) to be scanned into register 114 and the data generator 162. Then, controller 150 sets the select control signals 114, 146, 148 to 0 to put the registers 110, 136, 138 into self-test mode, sets the inhibit signals 133, 135 to 0 to allow the counters 132, 134 to self-increment, and sets the MCTL control signal to 1 to put the data modifier 112 and data generator 162 into complementary mode. The MCTL, inhibit, and select control signals are preferably maintained at these initial values throughout phase two.

After initialization, controller 150 is ready to start phase two operation. It should be noted here that steps 222–234 in phase two are identical to steps 202–214 in phase one. To avoid repetition, the steps 222–234 in phase two will not be described in detail. Controller 150 begins phase two operation by generating and sending 222 a write control signal to the memory 102 and to WAR 138, and by generating and sending 224 a read control signal to memory 102 and RAR 138. Steps 222 and 224 are repeated until all addresses in memory 102 have been written to. When controller 150 determines 226 that write address counter 134 has completed a full cycle and thus, has a count value of 0x0, it proceeds to compare the data values stored in memory 102 with a set of reference data values. Controller 150 carries out the comparison process by first generating and sending 228 a read control signal to memory 102 and RAR 132 to read data from the memory 102. Then, controller 150 generates and sends 230 a sync control signal to comparator 160 and data generator 162 to effect the comparison of data from the memory 102 with the reference data from data generator 162. Steps 228, 230 are repeated 232 until the read address counter 132 completes a full cycle and, hence, is reset to 0x0. When that occurs, controller 150 stores 234 the value of the error signal 164 from comparator 160, resets the error signal, and proceeds to phase three.

As with phases one and two, phase three begins with an initialization step 240 (FIG. 7C). In step 240, controller 150 scans ~(0x1) into the data generator 162 so that the initial data in data generator 162 matches the data stored (during phase two) in the fast address of memory 102. By providing the data generator 162 with the proper initial data set, controller 150 ensures that the data generator 162 will generate the proper data sequence. In step 240, controller 150 also sets the MCTL control signal to 1 to put data modifier 112 and data generator 162 into complementary mode, and sets the select signals 114, 146, 148 to 0 to put the registers 110, 136, 138 into self-test mode. The MCTL and select signals are maintained at these initial levels throughout phase three. In addition, controller 150 sets the inhibit signals 133, 135 to 1 to inhibit the incrementing function of the counters 132, 134. The mason for this will become clear as phase three operation is further described. Furthermore, controller 150 resets an internal counter to 0 to ready the counter for phase three operation.

After initialization, controller 150 starts phase three operation by generating and sending 242 a read control signal to memory 102 and to RAR 136. This read control signal causes RAR 136 to output the address received from counter 132 to the read address lines, and causes the memory 102 to read out data from the address received from the read address register 136. Note that although the output of RAR 136 is fed back to the input of counter 132, the inhibit signal 133 prevents counter 136 from receiving the feedback signal. Consequently, counter 132 is not incremented.

After data is read out of memory 102, the data is modified by data modifier 112 to produce a set of modified data. The modified data is sent to the input port 108 of memory 102 via the 2-port register 110. To write the modified data into the memory 102, controller 150 generates and sends 244 a write control signal to memory 102 and to WAR 138. The write control signal causes the write address register 138 to output the address received from counter 134 onto the write address lines. The write control signal also causes the data at input port 108 to be written into the memory at the address indicated by the write address lines. The result of step 244 is that modified data is written into the same address as that from which data was read. Note that like counter 132, the write address counter 134 is inhibited during step 244. Hence, counter 134 is not incremented by the write operation.

After the read and write operations, controller 150 increments 246 its internal counter. Controller 150 then checks 248 the value of the internal counter to determine whether the count has reached n (the number of storage cells in each memory storage location). If the count has not reached n, controller 150 repeats steps 242, 244, and 246. Note that during the entire loop 242–248. both of the address counters 132 and 134 are inhibited. Hence, neither counter is incremented. Consequently, loop 242–248 causes data to be read from, and data to be written to, the same address in the memory, an n number of times.

When controller 150 determines 248 that the internal counter has reached the value of n, the controller 150 sets 250 the inhibit signals 133, 135 to 0 to allow the counters 132, 134 to increment. Then, controller 150 sets the inhibit signals 133, 135 back to 1 to once again inhibit the incrementing function. In effect, step 250 selects the next address in memory 102 for processing by loop 242–248. After step 250, controller 150 checks 252 the read address counter 132 for a 0x0 value. If counter 132 does not have a value of 0x0, then it means that all addresses in the memory have not been processed by loop 242–248. Accordingly, controller 150 resets 254 its internal counter to and loops back to step 242 to process the next address. Steps 242–252 are repeated until all addresses in the memory 102 are processed, i.e. counter 132 has a count of 0x0.

Once all addresses have been read from and written to an n number of times, controller 150 proceeds to compare the data stored in memory 102 to reference data generated by data generator 162. Controller 150 carries out the comparison process by first setting 256 the inhibit signal 133 to 0 to allow the read address counter 132 to increment freely. Controller 150 then generates and send 258 a read control signal to the memory 102 and to the RAR 136. This read control signal causes data to be read from the memory 102, and also increments the read address counter 132. After data is read out of memory 102 and sent to comparator 160, controller 150 generates and sends 260 a sync control signal to the comparator 160 and to the data generator 162. The sync control signal synchronizes the operation of the two components to ensure that the proper data sets are compared to each other. Steps 256–260 are repeated until controller 150 determines 262 that counter 132 has reached a count of 0x0. When the count reaches 0x0, it means that data from all addresses in memory 102 have been read out and compared to reference data. Thus, phase three testing is complete. Accordingly, controller 150 stores the value of the error signal from comparator 160, resets the error signal, and stops operation.

To determine whether the memory 102 contains any faults, one simply needs to check the value of the error signal 164 from the comparator 160 at the end of each of the three phases. If an error signal is present at the end of any of these phases, then the memory contains at least one fault. Since these error signal values are stored within the BIST controller 150, determining whether the memory 102 contains a fault is a simple matter.

It was previously mentioned that the magic function guarantees data distinctiveness among the various storage locations if the memory tested is a $2^k \times n$ memory and n>k. This does not mean, however, that the present invention cannot be used to test memories where k>n. To illustrate, suppose that a $2^9 \times 8$ memory needs to be tested. Since $9>8$, the magic function cannot guarantee data distinctiveness for this memory. However, the memory may be divided into two memories, a $2^7 \times 8$ memory and a $384 \times 8$ memory, both of which satisfy the inequality $n>k$. If each portion of the memory is tested separately, then the magic function can guarantee data distinctiveness among the various storage locations. Thus, by breaking the memory into appropriately-sized chunks, it is possible to use the present invention to test the memory. Consequently, the present invention may be used to test memories of all sizes.

What is claimed is:

1. A method for operating a memory having a plurality of storage locations, each storage location having a unique address and each storage location comprising n storage cells, said method comprising the steps of:

(a) initializing said memory by writing data to each of the addresses;

(b) selecting a particular address;

(c) reading a set of stored data from the selected address;

(d) modifying said stored data to produce a set of modified data;

(e) writing said modified data back to the selected address; and (f) repeating steps (c) through (e) until the selected address has been read from and written to a selected number of times.

2. The method of claim 1, wherein steps (c) through (e) are repeated n number of times.

3. The method of claim 1, wherein by the end of step (f), each and every pair of storage cells at the selected address will have simultaneously experienced opposite binary values to provoke all possible bit coupling faults within the selected address.

4. The method of claim 1, wherein said memory is initialized by writing a distinct set of data to each address.

5. The method of claim 1, further comprising the step of:

(g) repeating steps (b) through (f) until all addresses in said memory have been selected.

6. The method of claim 5, further comprising the step of:

(h) comparing data values stored in said memory with a set of reference data values to determine whether said memory contains any defects.

7. An apparatus for testing a memory having a plurality of storage locations, each storage location having a unique address, said apparatus comprising:

a data modifier having a modifier input coupled to a data output of the memory, and a modifier output coupled to a data input of the memory, said data modifier processing data received at said modifier input to produce a set of modified data at said modifier output; and a controller for controlling said memory, said controller selecting an address and causing said memory to output a set of stored data from the selected address to said modifier input, and to store the modified data received on said data input from said modifier output back in said selected address, said controller causing said memory to output stored data from said selected address and to store modified data back in said selected address a selected number of times.

8. The apparatus of claim 7, wherein said controller selects each of the addresses in said memory to cause the memory to output data from, and to store modified data in, each of the addresses in said memory a selected number of times.

9. The apparatus of claim 8, further comprising a comparator coupled to the data output of the memory for comparing data values stored in said memory with reference data values to determine whether said memory contains any defects.

* * * * *